United States Patent [19]

Ishii et al.

[11] Patent Number: 4,958,094
[45] Date of Patent: Sep. 18, 1990

[54] EMITTER FOLLOWER CIRCUIT WITH MOSFET

[75] Inventors: Yasuhiro Ishii, Tokyo; Isao Fukushi, Yokohama, both of Japan

[73] Assignee: Fujitsu Limited, Kawasaki, Japan

[21] Appl. No.: 391,605

[22] PCT Filed: Sep. 13, 1988

[86] PCT No.: PCT/JP88/00923

§ 371 Date: Jun. 28, 1989

§ 102(e) Date: Jun. 28, 1989

[87] PCT Pub. No.: WO89/02677

PCT Pub. Date: Mar. 23, 1989

[30] Foreign Application Priority Data

Sep. 17, 1987 [JP] Japan .................. 62-233190

[51] Int. Cl.⁵ ............................................. H03K 17/16
[52] U.S. Cl. ..................................... 307/570; 307/443; 307/455; 307/296.3
[58] Field of Search ............... 365/177, 222; 307/443, 307/455, 467, 530, 570, 577, 579, 446, 296.3

[56] References Cited

U.S. PATENT DOCUMENTS

| | | | |
|---|---|---|---|
| 4,099,070 | 7/1978 | Reinert | 307/530 X |
| 4,168,540 | 9/1979 | Delker et al. | 365/227 |
| 4,587,444 | 5/1986 | Emori et al. | 307/455 X |
| 4,604,533 | 8/1986 | Miyamoto et al. | 307/530 |
| 4,663,104 | 12/1986 | Mallinson | 307/455 X |
| 4,713,560 | 12/1987 | Herndon | 307/570 X |
| 4,740,918 | 4/1988 | Okajima et al. | 365/227 X |
| 4,858,183 | 8/1989 | Scharrer et al. | 365/177 X |
| 4,868,421 | 9/1989 | Herndon et al. | 307/443 X |

FOREIGN PATENT DOCUMENTS

| | | |
|---|---|---|
| 0232969 | 8/1987 | European Pat. Off. . |
| 0300698 | 1/1989 | European Pat. Off. ........... 307/455 |
| 49-53365 | 9/1974 | Japan . |
| 54-28707 | 9/1979 | Japan . |
| 60-141019 | 7/1985 | Japan . |
| 2110029 | 6/1983 | United Kingdom . |

Primary Examiner—David Hudspeth
Attorney, Agent, or Firm—Armstrong, Nikaido, Marmelstein, Kubovcik & Murray

[57] ABSTRACT

In an emitter follower circuit including an emitter follower transistor (Q3, Q4), and a series-connected circuit connected to the emitter of the emitter follower transistor and including a current source (Q3, Q4) and a current source resistor, the current source resistor being formed by a MOS transistor (N4, N5), the emitter follower circuit being switched to active and inactive states by switching the state of the MOS transistor (N4, N5) by a control signal, there is provided current path means provided between the source and drain of the MOS transistor, for providing a resistance considerably larger than a resistance of the MOS transistor provided during conducting when the MOS transistor is at least cut off and passing an extremely small current passes therethrough at that time.

3 Claims, 5 Drawing Sheets

EMITTER FOLLOWER CIRCUIT WITH MOSFET

TECHNICAL FIELD

The present invention relates to an emitter follower circuit, and particularly to an emitter follower circuit employing a metal oxide semiconductor transistor.

BACKGROUND ART

Conventionally, an emitter follower circuit is used as an input circuit for inputting a signal or an output circuit for outputting a signal.

In a bipolar-complementaly metal oxide semiconductor (Bipolar-CMOS) circuit constructed by combining a bipolar circuit and a CMOS circuit, a MOS transistor included in a current source is cut off when the emitter follower circuit is set to the inactive state. Thereby, it becomes possible to prevent current from passing through the bipolar circuit and reduce power consumed therein.

FIG. 1 illustrates a level converter, which includes a conventional emitter follower circuit. Referring to FIG. 1, a differential circuit is made up of transistors Q1 and Q2. The transistor Q1 is supplied with a voltage signal through a terminal 10, and the transistor Q2 is supplied with a reference voltage $V_{REF}$ through a terminal 11.

Two output signals derived from the differential circuit pass through emitter follower circuits 12 and 13 including transistors Q3 and Q4, respectively, and are supplied to a flip-flop 14, which includes MOS transistors P1, P2, N1 and N2. An output signal derived from the flip-flop 14 passes through an inverter 15 including MOS transistors P3 and N3, and is output through a terminal 16. The flip-flop 14 has a function of converting the ECL (Emitter Coupled Logic) level of a supplied signal to the MOS level.

The emitter follower circuits 12 and 13 include transistors Q5 and Q6, respectively, which function as constant-current sources, each of which is supplied to a fixed voltage $V_R$ through a terminal 17. N-channel MOS transistors N4 and N5 are current source resistors, and conduct when a chip select signal CS applied through a terminal 18 is held at a high (H) level, so that emitter follower circuits 12 and 13 are held in the active state. The MOS transistors N4 and N5 are cut off when the chip select signal CL is switched to a low (L) level, so that the emitter follower circuits 12 and 13 are switched to the inactive state.

FIG. 2 illustrates a sense amplification circuit for a memory including a conventional emitter follower circuit. Referring to this figure, terminals 20a and 20b are connected to bit lines (not shown) which are paired. The voltages of the terminals 20a and 20b pass through emitter follower circuits 21 and 22 including transistors Q10 and Q11, respectively, and are then applied to a differential circuit made up of transistors Q12 and Q13. The collectors of the transistors Q12 and Q13 are coupled to corresponding current/voltage conversion circuits 25 and 26 through corresponding common lines 23 and 24, which are used in common with differential circuits associated with other bit lines. With the above-mentioned structure, current passing through the common line 23 becomes larger than that passing through the common line 24 when the level of the terminal 20a is higher than the level of the terminal 20b. At this time, the levels of the common lines 23 and 24 are held at almost identical levels.

A fixed voltage $V_{CNO}$ is applied, through a terminal 30, to the base of transistors Q14 and Q15, which are included in the current/voltage conversion circuits 25 and 26, respectively. Collector currents of the transistors Q14 and Q15 are converted to corresponding voltages by the MOS transistors N12 and N13, respectively, which function as resistors.

The output signals of the current/voltage conversion circuits 25 and 26 are supplied to a differential amplifier (not shown) of the next stage through terminals 27a and 27b, respectively.

The N-channel MOS transistors N10 and N11 included in the emitter follower circuits 21 and 22 are current source resistors. The MOS transistors N10 and N11 conduct when a bit select signal BS supplied from a terminal 28 through an inverter is held at L level, whereby the emitter follower circuits 21 and 22 are held in the active state. On the other hand, the MOS transistors N10 and N11 are cut off when the bit select signal BS is held at H level, so that the emitter follower circuits 21 and 22 are held in the inactive state.

Turning to FIG. 1, when the emitter follower circuits 12 and 13 are switched to the inactive state, the potential of the emitter of each of the transistors Q3 and Q4 becomes unstable. Therefore, the flip-flop 14 becomes unstable, and the input signal of the inverter 15 is unnecessarily inverted. It is noted that the circuit of FIG. 1 is wasteful of current when the MOS transistors P1, P2, N1 and N2 included in the flip-flop 14 and the inverter 15 are inverted. The above leads to an increase of consumption power.

In the circuit of FIG. 2, the potential of emitter of each of the transistors Q10 and Q11 becomes unstable, when the emitter follower circuits 21 and 22 are switched to the inactive state. The emitter potentials of the transistors Q10 and Q11 decrease to the ground level (Vcc) as time goes. Therefore, it takes long for the emitter potential of each of the transistors Q10 and Q11 to become equal to the predetermined potential when the emitter follower circuits 21 and 22 is set to the active state again. The above prevents the sense amplifier from operating at high speeds.

DISCLOSURE OF THE INVENTION

An object of the present invention is to provide an emitter follower circuit capable of reducing power consumption in the level converter circuit and enabling it to be possible to operate the sense amplification circuit at high speeds.

The present invention relates to an emitter follower circuit including an emitter follower transistor, and a power source coupled to the emitter of the emitter follower transistor. The power source includes a MOS transistor, and the emitter follower circuit is switched between active and inactive states by switching the MOS transistor by a control signal. The present invention has the following essential features. That is, between the source and drain of the MOS transistor, there is provided current path means for providing a resistance considerably larger than a resistance of the MOS transistor provided during conducting, when the MOS transistor is at least cut off and for passing an extremely small current therethrough at that time.

In the present invention, the extremely small current passes through the current path means during the time when the MOS transistor is OFF so that the emitter potential of the emitter follower transistor can be stabilized. Thereby, it becomes possible to reduce the power consumption in the level converter circuit and make the sense amplification circuit operate at high speeds.

BEST MODE OF CARRYING OUT THE INVENTION

Figure 1:
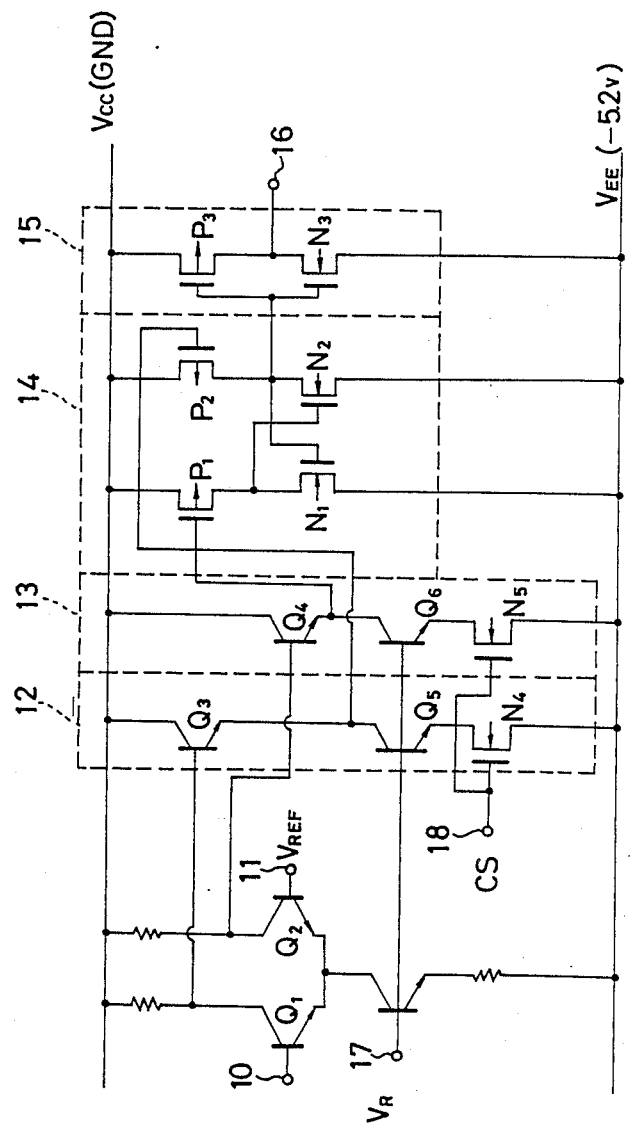
FIG. 1 is a circuit diagram of a level converter circuit which employs a conventional emitter follower circuit.
Figure 3:
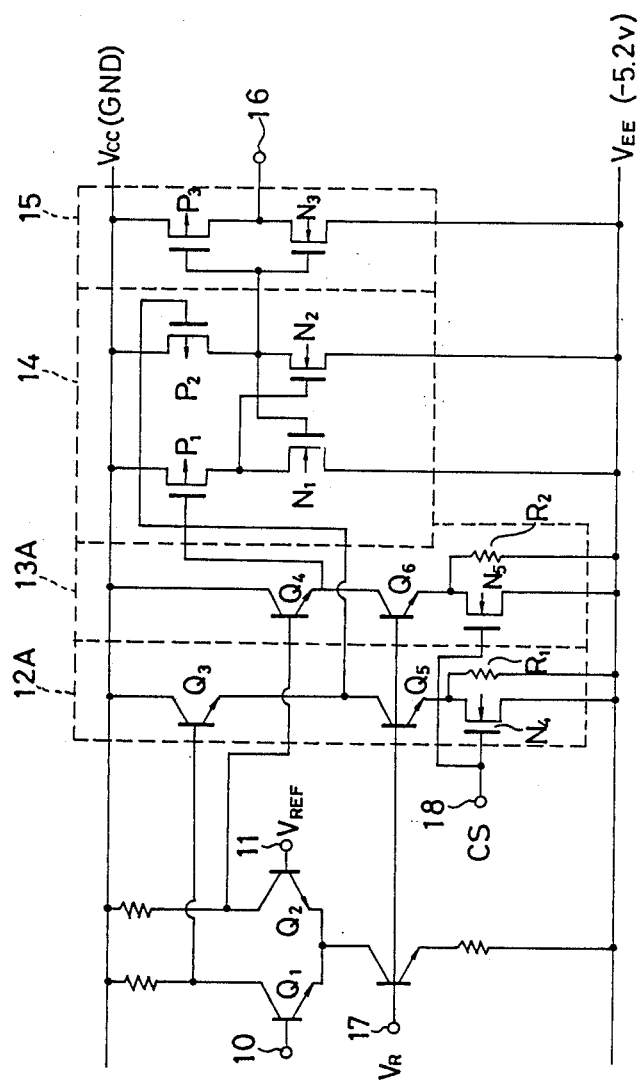
FIG. 3 is a circuit diagram of a level converter circuit in which an emitter follower circuit of an embodiment of the present invention is employed.

FIG. 3 is a circuit diagram of a level converter circuit in which an emitter follower circuit of an embodiment of the present invention is employed. In FIG. 3, those parts which are the same as those in FIG. 1 are given the same reference numerals, and a description of those parts is omitted. Emitter follower circuits 12A and 13A correspond to emitter follower circuits 12 and 13, respectively.

Referring to FIG. 3, a resistor R1 is connected across the source and drain of the MOS transistor N4 provided in the emitter follower circuit 12A. Similarly, a resistor R2 is connected across the drain and source of the MOS transistor N5.

The resistors R1 and R2 have resistances which are considerably larger than an ON resistance of each of the MOS transistors N4 and N5. It is preferable that each of the resistors R1 and R2 has a resistance as large as 10 times the ON resistance. Generally, the ON resistance of a MOS transistor is a few hundred ohms. Therefore, each of the resistors R1 and R2 is formed by a resistor having a resistance equal to or larger than a few kiloohms.

Thereby, during a time when the chip select signal CS is held at L level and therefore the emitter follower circuits 12A and 13A are held in the inactive state, an extremely small current (tens of $\mu A$ to hundreds of $\mu A$) pass through the resistors R1 and R2. During the time when the extremely small current pass through the transistors Q3 through Q6, the base-emitter voltage of each of the transistors Q3 through Q6 can be ensured. Therefore, the base-emitter voltage of each of the transistors Q3 and Q4 is stabilized. As a result, it becomes possible to prevent the flip-flop 14 and the inverter 15 from being inverted. Hence, it becomes possible to reduce the consumption power generated when the flip-flop 14 and the inverter 15 are held in the inactive state.

Figure 4:
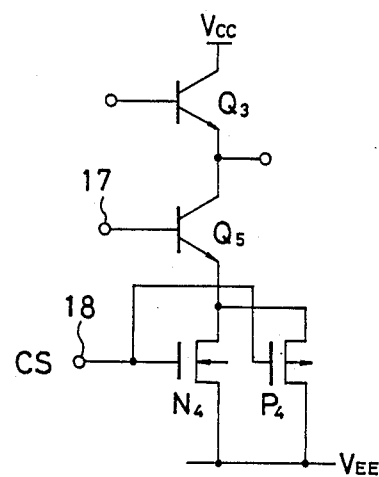
FIG. 4 is a circuit diagram of a variation of the present invention.

As is illustrated in FIG. 4, a P-channel MOS transistor may be substituted for the resistor R1 as the current path means. Referring to FIG. 4, the source and drain of the MOS transistor P4 are connected to the source and drain of the MOS transistor N4, respectively. The gate of the MOS transistor P4 is connected to the terminal 18. The ON resistance of the MOS transistor P4 is selected in the same way as the resistor R1. In the case of FIG. 4, an extremely small current passes through the MOS transistor P4, only when the MOS transistor N4 is cut off and thereby the emitter follower circuit 12A is held in the inactive state.

Of course, the resistor R2 may be replaced with a P-channel MOS transistor as described previously.

Figure 2:
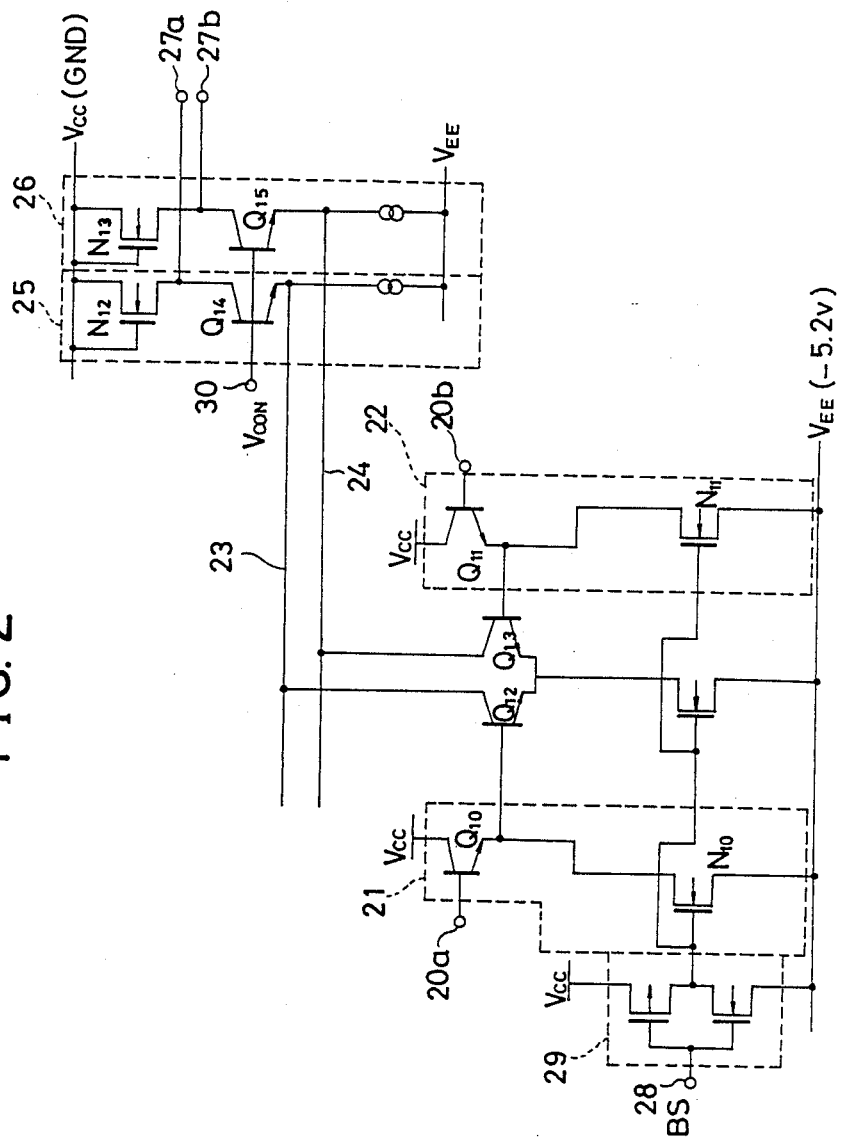
FIG. 2 is a circuit diagram of a sense amplifier which employs a conventional emitter follower circuit.
Figure 5:
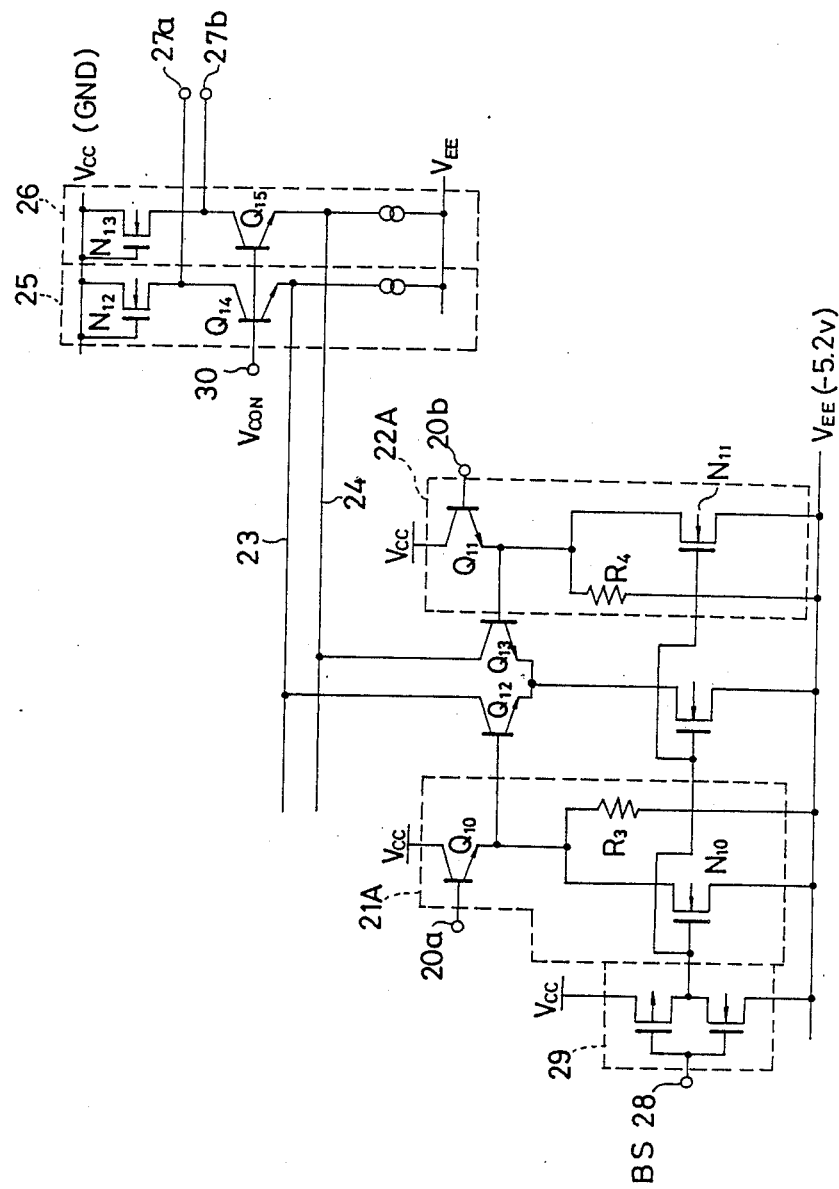
FIG. 5 is a circuit diagram of a sense amplifier in which the present invention is employed.

FIG. 5 illustrates a sense amplifier to which the present invention is applied. In FIG. 5, those parts which are the same as those in FIG. 2 are given the same reference numerals, and a description thereof is omitted. Emitter follower circuits 21A and 22A correspond to the aforementioned emitter follower circuits 21 and 22.

Referring to FIG. 5, a resistor R3 is connected across the drain and source of the MOS transistor N10 provided in the emitter follower circuit 21A, and a resistor R4 is connected across the drain and source of the MOS transistor N11. The resistances of the resistors R3 and R4 are set considerably large, compared with the MOS transistors N10 and N11. Thereby, even when the bit select signal is held at H level and therefore the emitter follower circuits 21A and 22A are held in the inactive state, extremely small currents pass through the resistors R3 and R4. Therefore, the potentials of the emitters of the transistors Q10 and Q11 are fixed to levels which are lower by a fixed voltage than the potential of the terminals 20a and 20b respectively. Thereby, it becomes possible to reduce a time it take for the emitter potential of each of the transistors Q10 and Q11 to become equal to the predetermined potential when the emitter follower circuits 21A and 22A are switched to the active state.

In the circuit of FIG. 5, the P-channel MOS transistor as shown in FIG. 4 may be substituted for each of the resistors R3 and R4 as the current path means.

INDUSTRIAL APPLICABILITY

As described above, according to the emitter follower circuit of the present invention, an extremely small current passes through the emitter follower circuit when held in the inactive state, and thereby emitter potential of the emitter follower transistor can be settled. As a result, it becomes possible to reduce the consumption power in the level converter circuit and operate the sense amplification circuit at high speeds. Consequently, the present invention is effective to practical use.

We claim:

1. An emitter follower circuit comprising an emitter follower transistor and a current source coupled to the emitter of said emitter follower transistor, said current source including a MOS transistor, said emitter follower circuit being switched between active and inactive states by switching said MOS transistor by a control signal, characterized in that said emitter follower circuit comprises current path means provided between the source and drain of said MOS transistor, for providing a resistance considerably larger than a resistance of the MOS transistor provided during conducting, when the MOS transistor is at least cut off and for passing an extremely small current therethrough at that time.

2. An emitter follower circuit as claimed in claim 1, characterized in that said current path means comprises a resistor.

3. An emitter follower circuit as claimed in claim 1, wherein said current path means comprises a MOS transistor of the type different from that of the MOS transistor served as said current source, and the gate, drain and source of said MOS transistor of said current path means are connected to the gate, source and drain of said MOS transistor of said current source, respectively.

* * * * *